United States Patent [19]
Houle et al.

[11] Patent Number: 5,422,835
[45] Date of Patent: Jun. 6, 1995

[54] DIGITAL CLOCK SIGNAL MULTIPLIER CIRCUIT

[75] Inventors: Robert M. Houle, Burlington, Vt.; Dac C. Pham, Round Rock, Tex.

[73] Assignee: International Business Machines Corporation, Armonk, N.Y.

[21] Appl. No.: 98,189

[22] Filed: Jul. 28, 1993

[51] Int. Cl.⁶ .............................................. G06F 7/52
[52] U.S. Cl. ................................................... 364/703
[58] Field of Search .................. 364/700, 703, 701; 307/606, 262, 603, 595

[56] References Cited

U.S. PATENT DOCUMENTS

| | | | |
|---|---|---|---|
| 3,673,391 | 6/1972 | Lougheed | 364/703 |
| 4,773,031 | 9/1988 | Tobin | 364/703 |
| 4,922,141 | 5/1990 | Lofgren et al. | 307/595 |
| 5,010,561 | 4/1991 | Itoh | 377/47 |
| 5,059,838 | 10/1991 | Motogi et al. | 307/603 |
| 5,179,294 | 1/1993 | Bechade et al. | 370/265 |
| 5,260,608 | 11/1993 | Marbot | 307/262 |

Primary Examiner—Roy N. Envall, Jr.
Assistant Examiner—Chuong D. Ngo
Attorney, Agent, or Firm—Heslin & Rothenberg

[57] ABSTRACT

A digital clock signal multiplier circuit for generating an on-chip clock signal having a higher frequency than a system clock signal. A variable delay line, coupled to receive the system clock signal, is partitioned into (N) equal segments with each segment having multiple delay elements. Each of the delay elements is tapped to allow selective output of a corresponding delay signal. Multiple control switches, each associated with one of the delay elements, provide selective control for issuance of only one delay signal from each segment of the variable delay line. Delay signals selected for output are symmetrically offset and are fed to (N) pulse generators for the production of (N) pulse signals of duration substantially less than the period of the external clock signal. An output generator is coupled to receive the pulse signals output from the (N) pulse generators and produce therefrom the internal clock signal of desired frequency. Control circuitry selects the delay signals output from the (N) equal segments via appropriate activation of the associated control switches.

20 Claims, 4 Drawing Sheets fig. 1 fig. 2 fig. 4 fig. 3 fig. 5 fig. 6

DIGITAL CLOCK SIGNAL MULTIPLIER CIRCUIT

TECHNICAL FIELD

This invention relates in general to integrated semiconductor chip timing or clock circuitry and, more particularly, to a digital circuit for generating an internal clock signal having higher frequency than the frequency of a received, system clock signal.

BACKGROUND ART

As the speed of silicon circuits continues to increase, bus timings are becoming a limiting factor in system performance. Frequently, semiconductor chips could operate at internal frequencies that are multiples of the external system clock frequency rate. This is especially true for microprocessors that contain on-board instruction and data cache since such processors can carry out multiple machine cycles without need to reference information via an external bus.

Existing approaches to accomplishing clock signal frequency multiplication typically employ an analog phase locked loop or a digital phase locked loop. Unfortunately, such circuits can be difficult to design and implement. (For example, analog phase locked loops often require components external to the semiconductor chip.) Thus, there is a genuine need in the art for a more practical approach to on-chip clock signal frequency multiplication for enhancing chip processing performance.

DISCLOSURE OF THE INVENTION

Briefly summarized, the present invention comprises in one aspect a digital semiconductor chip multiplier circuit for generating an internal clock signal having a frequency $(X) \times (f)$ from an external clock signal of frequency $(f)$, wherein $X \geq 1$. The multiplier circuit includes an automated digital means for generating multiple symmetrical pulse signals in response to a periodic transition within the external clock signal. One of the multiple pulse signals is synchronized with a period of the external clock signal. An output generator is coupled to receive the pulse signals generated by the automated digital means and produce therefrom the internal clock signal of desired frequency $(X) \times (f)$. Control circuitry is coupled to the automated digital means for controlling timing of the symmetrically generated, multiple pulse signals such that the output generator produces the desired internal clock signal of frequency $(X) \times (f)$. The control circuitry is coupled to receive for comparison the external clock signal and one of the multiple pulse signals output from the automated digital means.

In another aspect, the invention comprises a digital signal multiplier circuit which receives an external clock signal having a frequency $(f)$ and a period $(T)$. The circuit outputs in response thereto a clock signal having a frequency $(N/2) \times (f)$, wherein $N = 2, 3, 4, \ldots$. This clock signal multiplier circuit includes a variable delay line coupled to receive the external clock signal. The variable delay line has $(N)$ equal segments, with each segment having multiple delay elements. The delay elements are each tapped to allow output of a corresponding delay signal. A control switch is associated with each delay element of the variable delay line for controlling issuance of the corresponding delay signal. These multiple control switches limit each of the $(N)$ equal segments of the variable delay line to outputting one delay signal as the external clock signal propagates through the variable delay line. $(N)$ pulse generators are coupled to receive respective delay signals output from the $(N)$ equal segments of the variable delay line, each of which outputs in response thereto a pulse signal. Each pulse signal has a duration substantially less than the period $(T)$ of the external clock signal. An output generator is coupled to receive pulse signals output from the $(N)$ pulse generators and therefrom produce the clock signal of frequency $(N/2) \times (f)$. Control circuitry is provided for selecting the delay signals output from the $(N)$ equal segments via activation of the multiple control switches. The control circuitry is coupled to receive for comparison the external clock signal and one of the delay signals output from the $(N)$ equal segments of the variable delay line.

To restate, a digital circuit is provided that produces, for example, an $(N/2) \times (f)$ chip clock output (wherein $N = 2, 3, 4 \ldots$) with very low latency and a near fifty (50%) percent duty cycle given an external clock signal with an arbitrary duty cycle and a substantially steady (or slowly varying) frequency $(f)$. Extension of the $3/2 \times$ multiplier design described herein below to an $(N/2) \times$ multiplier circuit (wherein N is a positive integer) is straight forward. The design is modular in nature, thereby allowing easy implementation for different input frequencies and good delay matching. With higher on-chip clock signal frequency, enhanced microprocessor performance is attained. Also, an on-chip clock signal is only produced in response to the external clock signal.

BRIEF DESCRIPTION OF DRAWINGS

These and other objects, advantages and features of the present invention will be more readily understood from the following detailed description of certain preferred embodiments of the present invention, when considered in conjunction with the accompanying drawings in which.

BEST MODE FOR CARRYING OUT THE INVENTION

This invention sets forth a circuit technique for producing an on-chip clock signal having a frequency $(N/2)$ times the frequency of a received, external system clock signal, wherein $(N)$ is a positive integer $> 1$. The output of the multiplier circuit is used by a semiconductor chip as an internal clock signal that clocks $(N/2)$ times the system clock frequency $(f)$. The resultant clock signal has a near fifty (50%) percent duty cycle (i.e., in the embodiment to be described). This is because the length of time that the resultant clock signal is logically high is approximately equal to the length of time that the clock signal is logically low. In the multiplier circuit presented, (N) is assumed to be 3, but the circuit can be easily modified for other values of (N). (Given current processor speeds, practical values of N are probably only (N)=2, 3 or 4. When (N) is equal to 2, the output clock has the same frequency (f) as the external clock signal, but a duty cycle that is close to fifty (50%) percent, irrespective of nonuniformity in the duty cycle of the external system clock signal. In this special case, no frequency multiplication occurs.)

Reference now is made to the drawings in which the same reference numbers are used throughout the different figures to designate the same or similar components.

Figure 1:
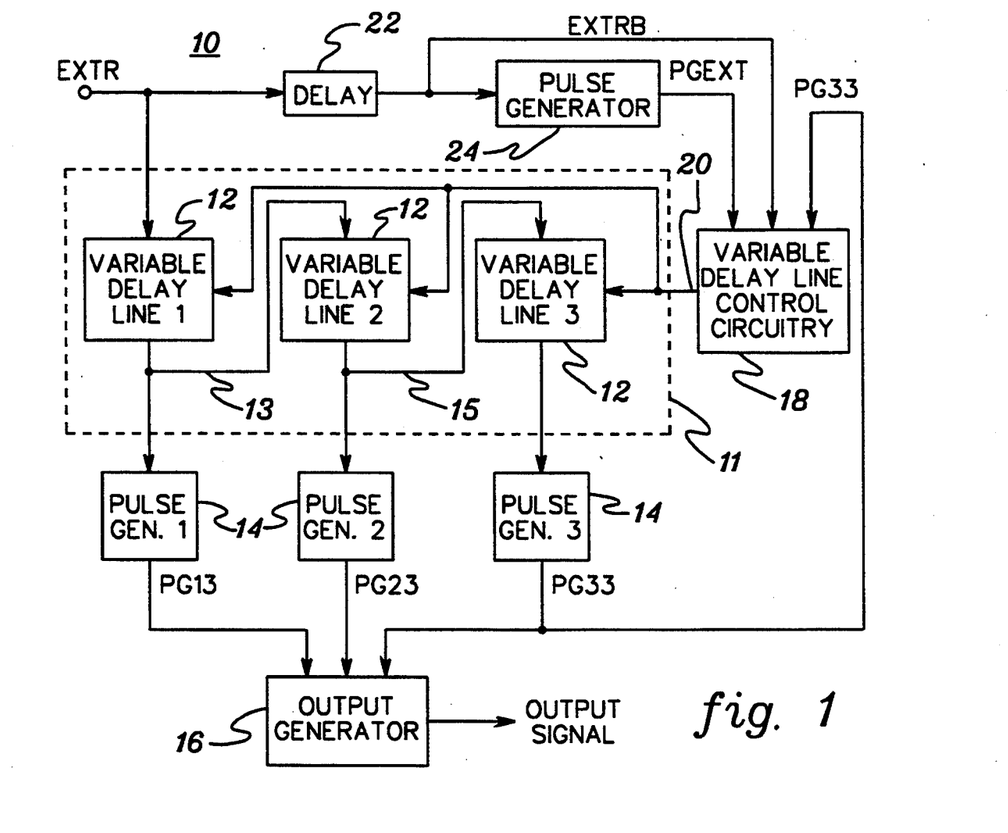
FIG. 1 is a schematic overview of one embodiment of a clock signal frequency multiplier circuit pursuant to the present invention.

FIG. 1 depicts one embodiment of a digital, clock signal frequency multiplier circuit, generally denoted 10, pursuant to the present invention. An external system clock signal "EXTR" having a substantially steady frequency (f) within a predefined range of potential frequencies and a period (T) is received at an input to a variable delay line 11 having multiple equal segments 12 denoted "Variable Delay Line 1," "Variable Delay Line 2," and "Variable Delay Line 3." Each segment 12 has the identical sequence of multiple delay elements such that the delay through each segment of variable length delay line 11 can be matched.

Figure 3:
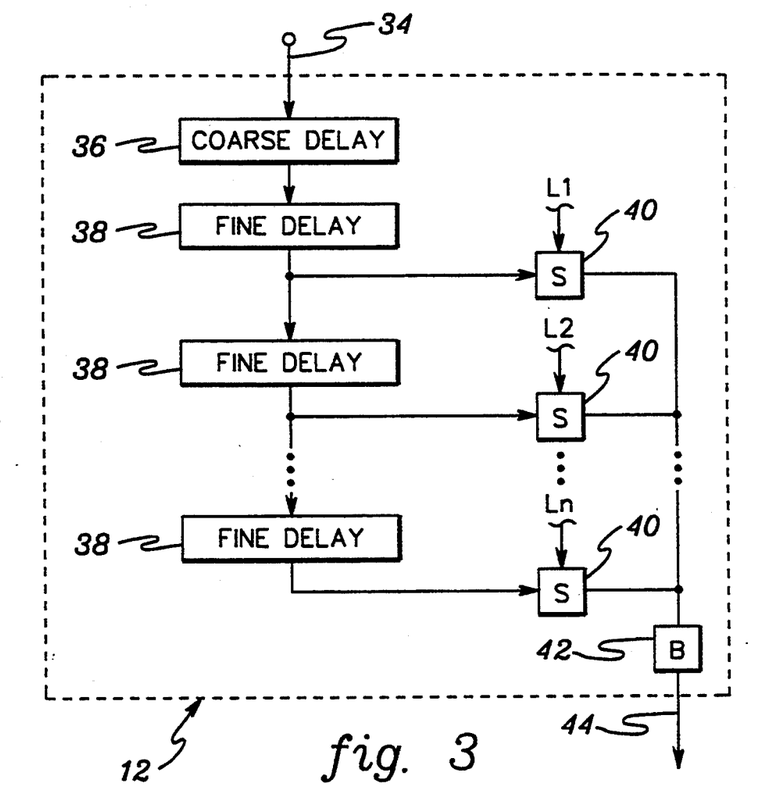
FIG. 3 is a schematic of one embodiment of one variable delay line segment of FIG. 1.

In one embodiment, three types of delay elements are employed within each segment, namely, one course delay element, n fine delay elements, and one buffer (see FIG. 3). Variable-length delay line 11 is constructed such that the output from the first segment "Variable Delay Line 1" is fed (via connect 13) to the input of the second segment "Variable Delay Line 2" and the output from the second segment "Variable Delay Line 2" is fed (via connect 15) to the input of the third segment "Variable Delay Line 3." Each segment output is also fed to a respective pulse generator 14 "Pulse Gen. 1," "Pulse Gen. 2" and "Pulse Gen. 3." Output from pulse generators 14 are three pulse signals PG13, PG23 and PG33 which comprise inputs to an output generator 16. Pulse signals PG13, PG23 and PG33 are substantially shorter in length than the period (T) of the external clock signal "EXTR." Generator 16 provides the desired on-chip output signal of frequency (N/2)×(f), where (f) comprises the frequency of the external clock system signal "EXTR."

In this embodiment, the pulse from the third pulse generator "Pulse Gen. 3" is also fed to a variable delay line control circuitry 18. Circuitry 18 is structured to compare the phase of the delay pulse signal PG33 with the external system clock signal "EXTR" phase. Before passing to control circuitry 18, however, signal "EXTR" is fed through a delay element 22 to produce a delayed, external system clock signal "EXTRB," which is also fed to a pulse generator 24 that produces a pulse signal "PGEXT" based thereon. Signal "PGEXT" is also provided to circuitry 18.

The control circuitry determines the amount of delay in each segment (or leg) of the variable length delay line. The output of each fine delay element (discussed below) is connected to a switch controlled by control circuitry 18. By selectively enabling these controllable switches, control circuitry 18 selects the length of delay through each segment of the variable delay line 11. As explained further below, circuits 11, 14 and 18 cooperate to continuously track the frequency of the external clock signal "EXTR" and attempt to place signal PG33 in phase with the external system clock signal, only offset by one period (T) of the external clock signal. This function is the same whether N=2, 3, 4 or more segments. Once settling out, signals PG13, PG23 and PG33 represent the ⅓, ⅔ and 3/3 time values of the period (T) of the external system clock signal.

Further description of certain major components of multiplier circuit 10 (FIG. 1) is provided below with reference to the circuit embodiments of FIGS. 2–4.

Figure 2:
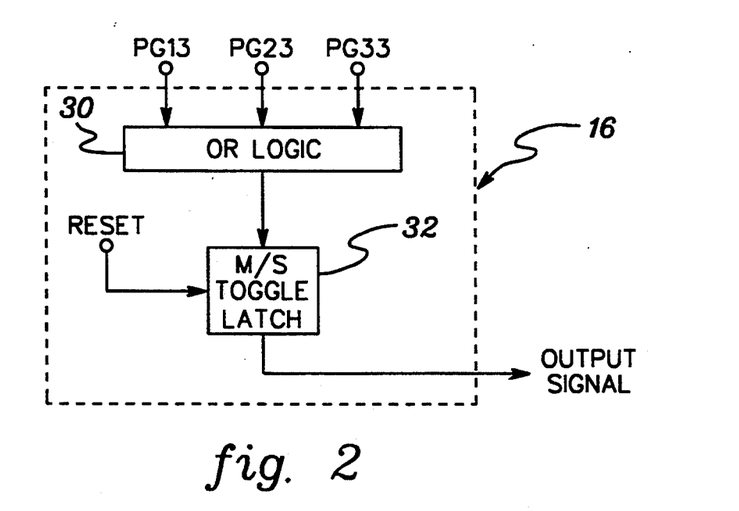
FIG. 2 is a schematic of one embodiment of the output generator of FIG. 1.

FIG. 2 presents one embodiment of output generator 16 which, as noted, provides the on-chip output signal (i.e., clock signal) in response to pulse signals PG13, PG23 and PG33. These signals are OR'ed together at an OR logic circuit 30 to produce a series of pulses which are provided to a master/slave toggle latch 32 to toggle the output thereof. Each time PG13, PG23 or PG33 pulses, the output of latch 32 changes state. A reset input to toggle latch 32 is coupled to the associated semiconductor chip's control circuitry (not shown). (A minimal amount of handshaking intercommunication (readily implementable by one skilled in the art) is employed between multiplier circuit 10 (FIG. 1) and the associated chip's control circuitry.)

Letting (D) be the total delay of each segment 12 of the variable delay line 11, PG13 is a pulse (D) time units after the external system clock signal "EXTR" goes from a low to a high state. (Preferably, the periodic low to high transitions are employed in the multiplier circuit of the present invention since such signals typically occur more precisely in time.) Similarly, PG23 pulses 2D time units after signal "EXTR," and PG33 pulses 3D time units after the external clock signal "EXTR." Thus, for every low to high transition of signal "EXTR," the output toggles 3 times. A 3/2 (1.5×) frequency multiplication therefore occurs. (In one external period, signal "EXTR" toggles twice, while the on-chip output signal toggles 3 times.)

The total delay of all segments combined is continuously modified so that the rising edge of pulse signal PG33 aligns with the rising edge of the delayed, external clock signal "EXTRB", only offset by one period (T) of the external system clock signal. Since each segment consists of matched elements, the phase length, (i.e., the time between each output toggle) is T/3. Thus, the output signal is 1.5 times the frequency of the external clock signal input to the variable delay line and each phase of the output is of equal length such that the output signal has an approximately fifty (50%) percent duty cycle.

By way of example, FIG. 3 is one embodiment in a segment 12 of variable delay line 11 (FIG. 1). In this embodiment, a clock signal, whether comprising the external clock signal "EXTR" or a delayed version thereof from an adjacent delay segment, is received at an input 34 and passed to an optional coarse delay 36. Depending upon the range of input frequencies to be accommodated by circuit 10 (FIG. 1), coarse delay 36 may be employed so that each segment of the delay line is automatically spaced by a fixed amount. For example, if the anticipated external system clock frequency range is 20–66 MHz (i.e., 15 ns–50 ns), then a coarse delay of one nanosecond could be safely used. If a fixed (coarse) delay is not employed, additional fine delay elements could be substituted. Within each identical segment, a series of fine delay elements 38 follows coarse delay 36. The output of each fine delay element 38 is connected to an associated pass gate switch 40. As discussed below, the status of the gates of switches 40 are determined by a corresponding value L1, L2, . . . Ln in a circular control shift register (FIG. 4) of control circuitry 18 (FIG. 1). In each segment 12, only one switch 40 is enabled at a time. By moving the one enabled switch up or down within the segment (or left or right if the segment is horizontally disposed), the delay therethrough is changed.

Initially, the n-bit bi-directional control shift register in control circuitry 18 (FIG. 1 and discussed below) is set to a binary value "100 ... 00" so that only the output of the first fine delay element (i.e., the output controlled by signal L1) in each segment of the variable delay line is connected to the next leg of the line. Thus, as noted, only one delay 38 is output from the series of fine delay elements. This output passes through an output buffer 42 to the corresponding pulse generator and/or the next segment of the variable delay line.

Figure 4:
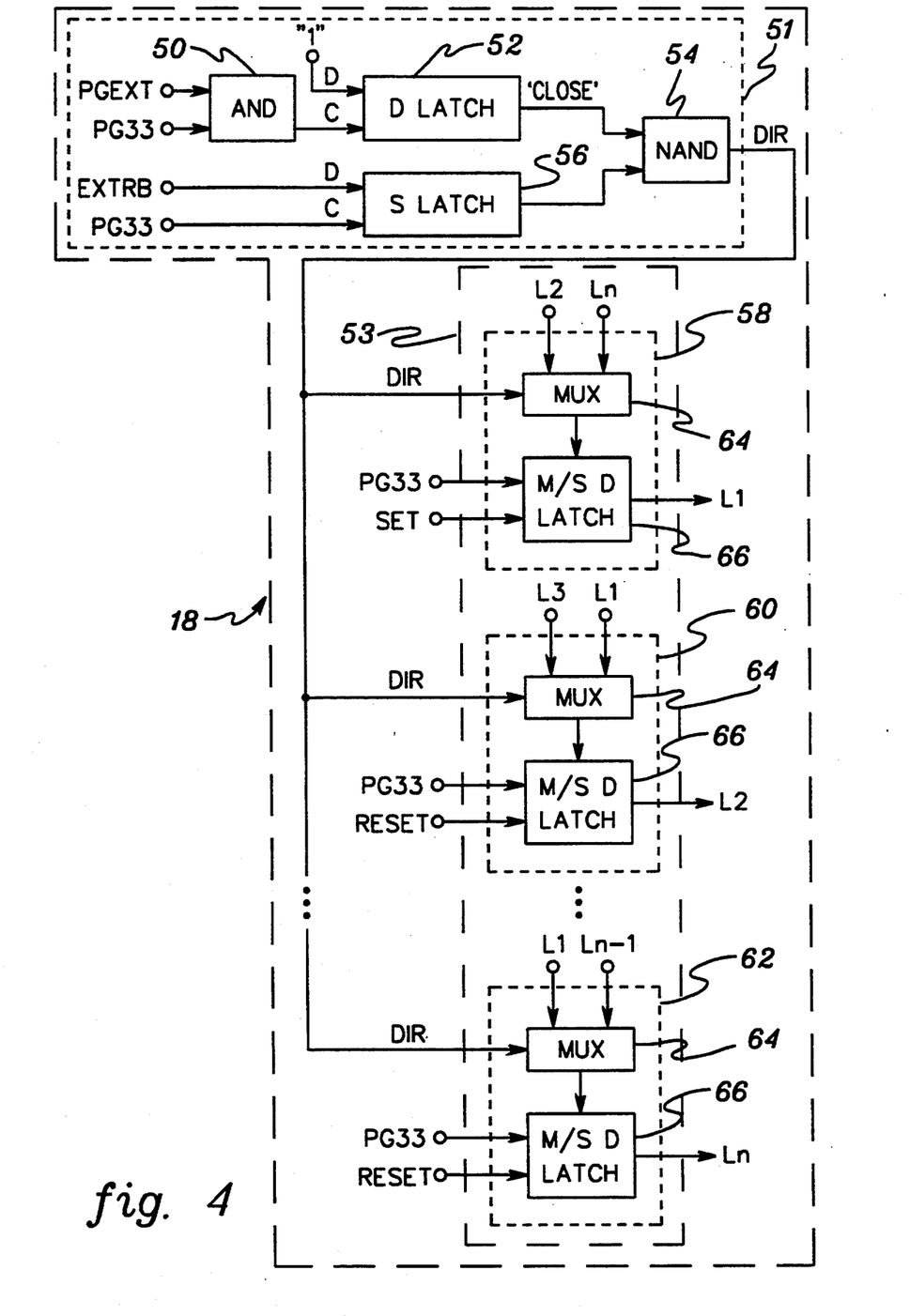
FIG. 4 is a schematic of one embodiment of the control circuitry of FIG. 1.

One embodiment of control circuitry 18 is depicted in FIG. 4. A circular shift register 53 is implemented via MUX/latch combinations 58, 60, ... 62 as shown. Directional input "DIR" to the circular shift register is provided by a sampling circuit, generally denoted 51. Initially, circuit 51 receives and compares from pulse generator 241 (FIG. 1)) signal PGEXT and from the last pulse generator ("Pulse Gen. 3" in FIG. 1) signal PG33. These signals are combined by an AND logic circuit 50, the output of which comprises the clock "C" input to a D latch 52. The data input "D" to latch 52 is tied to a high or "1" state.

Figure 5:
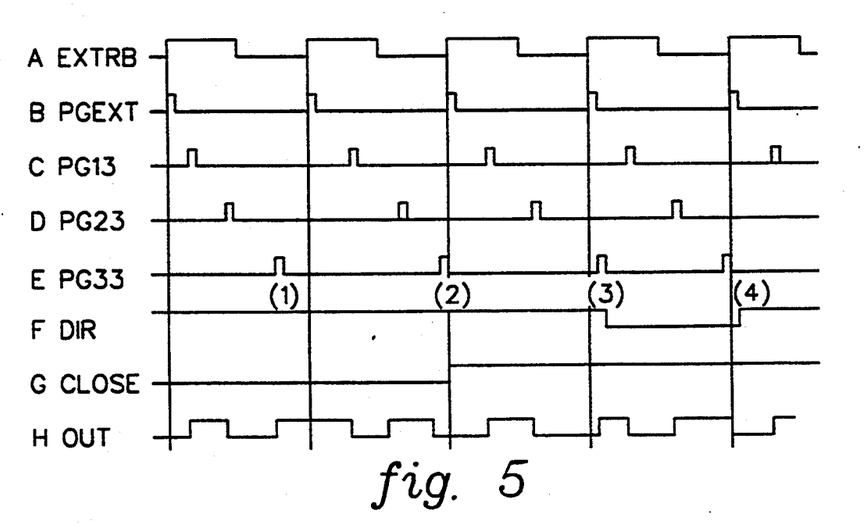
FIG. 5 is a sample timing diagram of various clock signals and pulses within a clock signal frequency multiplier circuit pursuant to the present invention.

Initially, it is assumed that signal PG33 occurs much sooner than one period of the external system clock signal "EXTR" (see FIG. 5). Based on this assumption, there will be no overlap between signals "PGEXT" and PG33 at the input to AND circuit 50. Thus, the output of circuit 50 will comprise a "0" and D latch 52 will remain as initialized, i.e., "0". This condition continues until a state change occurs at the clock input to latch 52. A "CLOSE" signal output from latch 52 of "0" means that the subsequent NAND gate 54 will have a "1" output. NAND gate 54 output, which comprises signal "DIR," is a "1" when more delay is to be symmetrically added to the delay line segments of the variable delay line. The circular shift register portion 53 of control circuitry 18 accomplishes this function. Since each component of the register 53 is identical, only circuit 58 is described.

Since register 53 is circular, the L1 MUX 64 has as input the nth control signal (Ln) and the second control signal (L2). MUX 64 is enabled by signal "DIR." Since initially signal (L1) is assumed to be high, the output from MUX 64 is low, meaning that an associated master/slave D latch 66 also has a zero output. Clock and data inputs to latch 66 are pulse signal PG33 and a "SET" signal, respectively. The "SET" signal is from the semiconductor chip's control circuitry (not shown). Signal "SET" is high only when the system is initialized. Thereafter, a "RESET" signal directs the resetting of the corresponding latches. Assuming that the output of the second fine delay element is to be acknowledged, input to MUX 64 of MUX/latch combination 60 is high ("1") meaning that latch 66 thereof is enabled and a positive output control signal (L2) is provided to the variable delay line.

As noted, circuitry 53 comprises an n-bit bidirectional control shift register having a binary value wherein only one control signal (L1), (L2), . . . (Ln) is high. Therefore, the output of only one fine delay element is provided as the respective segment's output. The shift register clock is PG33. Whenever signal PG33 pulses, the value in the control register is shifted up or down one position. Again, at any time only one bit of the control shift register is high ("1") and all other bits are low ("0"). Shifting of the control register down causes one fine delay element to be added to each segment, while shifting of the register up one position causes one fine delay element to be removed from each segment of the variable delay line. (Up/down having reference to the vertically oriented control shift register embodiment of FIG. 4.)

As noted, the direction control "DIR" is preferably initially set to one (i.e, add delay) until signal PG33 starts to overlap signal "PGEXT." Once overlap occurs, output from D latch 52, i.e., "CLOSE", goes high ("1"), and direction is thereafter determined by a sample value of the delayed external clock signal "EXTRB" whenever signal PG33 rises. This is accomplished by a sampling S latch 56. Signal PG33 is input to the clock "C" input and signal "EXTRB" is provided to the data input "D" to S latch 56. If signal "EXTRB" is high when signal PG33 goes high, then the direction signal "DIR" is forced low ("0") to remove delay from each segment of the variable delay line. Conversely, if signal "EXTRB" is low ("0") when signal PG33 goes high ("1"), direction signal "DIR" is forced high ("1") to add delay to each segment of the variable delay line. This causes the rising edge of signal PG33 to align with the rising edge of the delayed external clock signal "EXTRB," plus/minus a slight offset due to jitter.

A timing diagram for selected signals within a frequency multiplier in accordance with the present invention is provided in FIG. 5. As shown by the location of signal PG33 within successive "EXTRB" periods, delay is added when signal PG33 pulses and direction "DIR" is equal to a "1". When signal PG33 overlaps pulse signal "PGEXT" from the external clock signal (pt. (3)), signal "CLOSE" is set to "1" and direction symbol "DIR" equals "1" (because sampled signal "EXTRB" is "0" ("EXTRB"="0" when signal PG33 is rising). Once too much delay is recognized, and the delayed clock signal "EXTRB" equals "1"; when PG33 rises, the direction symbol "DIR" changes to a "0" state. In stable operation, direction symbol "DIR" flipflops back and forth between values "0" and "1." This jitter is believed acceptable because fine delay elements are employed, for example, with a 0.2 nanosecond delay.

The circuit can also be modified to correct for latency. Latency is the time delay between the rising edge of the external system clock signal "EXTR" and the corresponding rising (or falling) edge of the output signal clock from the frequency multiplier circuit. This latency is principally due to delays in the pulse generators, and the OR and toggle circuits. If the total latency delay is assumed to be removed from the coarse delay blocks and added to each segment of the variable delay line after the point at which the respective pulse generator is connected, then the T/N intermediate pulses (i.e., PG13, PG23, PG33) can be removed earlier in time, thereby eliminating the latency. Such a circuit is depicted in FIG. 6; again for the case where (N)=3.

Figure 6:
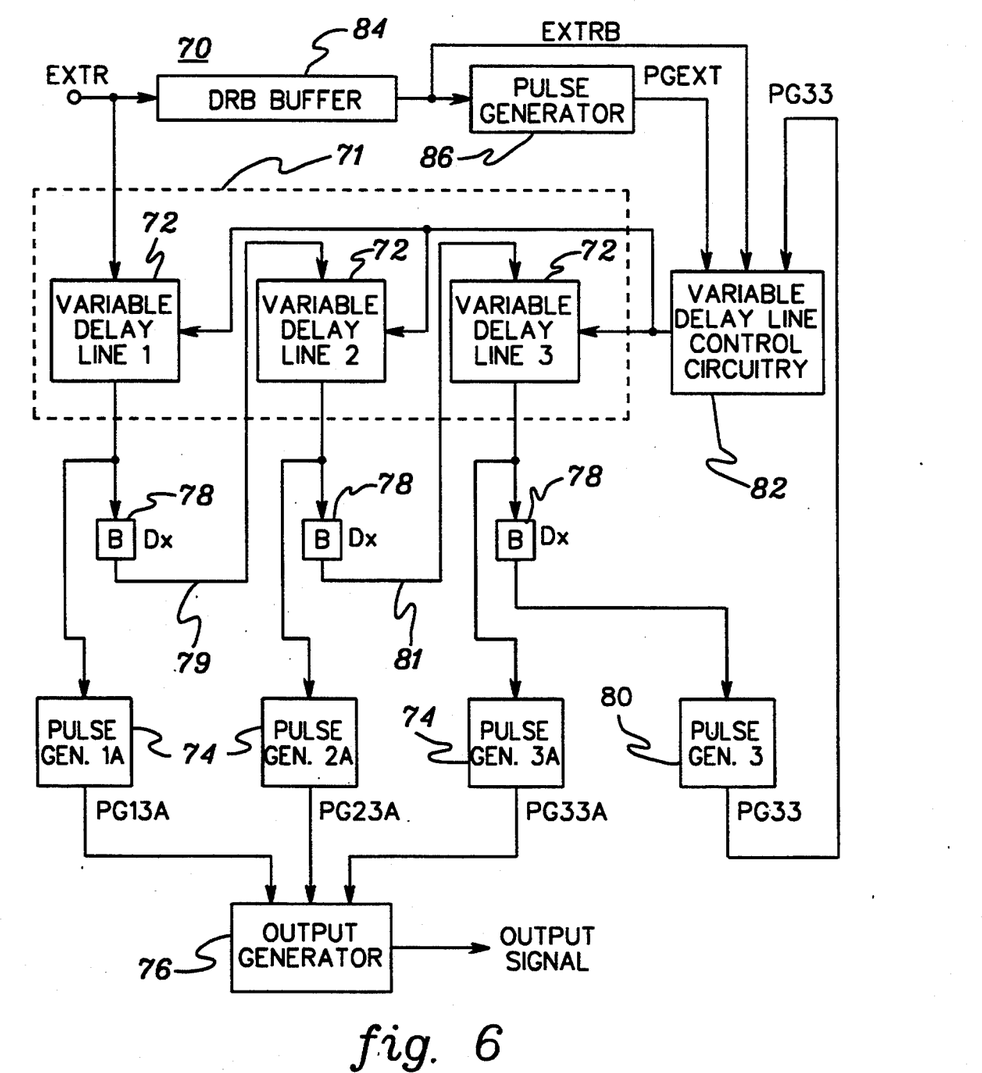
FIG. 6 is a schematic overview of an alternate embodiment of a clock signal frequency multiplier circuit pursuant to the present invention.

Multiplier circuit 70 of FIG. 6 is substantially identical to multiplier circuit 10 of FIG. 1, except as otherwise noted. The external system clock signal "EXTR" is fed to the input of a variable delay line 71 segmented into multiple legs 72 "Variable Delay Line 1," "Variable Delay Line 2," and "Variable Delay Line 3." The output of "Variable Delay Line 1" is fed to the input of "Variable Delay Line 2" (via connect 79) after passing through a buffer 78 of delay Dx. Similarly, the output from "Variable Delay Line 2" is fed (via connect 81) to the input of "Variable delay line 3," again after passing through a buffer 78 of delay Dx. The delay signals into pulse generators 74 ("Pulse Gen. 1A," "Pulse Gen. 2A" and "Pulse Gen. 3A") are taken prior to buffers 78.

The outputs PG13A, PG23A, PG33A of pulse generators 74 are fed to an output generator 76 which based thereon provides the desired on-chip, output signal clock. The output of the variable delay line is also fed through a buffer 78 of delay Dx before passing to a pulse generator 80 for generation of a timing pulse PG33 to be fed to variable delay line control circuitry 82. Control circuitry 82 controls the delay through the various segments of the variable delay line. Also input to control circuitry 82 are the external system clock signal delayed by a DRB buffer 84 ("EXTRB") and a pulse signal "PGEXT" converted therefrom via a pulse generator 86.

Note that the delay of each coarse block is assumed to be reduced in circuit 70 by delay Dx and a buffer of delay Dx is added to each segment after the pulse generator tap point. To maintain the timing of last pulse generator signal (PG33) another pulse generator is required on the last leg of the variable delay line. Letting "D+Dx" be the total delay of each segment, and letting Dx be the delay of the new buffer, then the following can be written:

The rising edge of "EXTR" occurs at 0, $T$, $2T$, etc.
"EXTRB" rises at $0 + Drb$, $T + Drb$, etc.
"PGEXT" occurs" at $Drb + Dpg$
PG13A "occurs" at $D + Dpg$
$\Rightarrow$ Out13: $D + Dpg + Dor + Dtog$
PG23A "occurs" at $2D + 2x + Dpg$
$\Rightarrow$ Out23: $2D + Dx + Dpg + Dor + Dtog$
PG33A "occurs" at $3D + 2Dx + Dgp$
$\Rightarrow$ Out33: $3D + 2Dx + Dpg + Dor + Dtog$
PG33 "occurs" at $3D + 3Dx + Dpg$ Wherein:
T = period of external oscillator (external system clock signal);
Drb = delay between "EXTR" and "EXTRB" of FIG. 1 and FIG. 6;
Dpge = delay of Pulse Gen. that forms "PGEXT";
Dpg = delay of Pulse Gen that forms PG13A or PG23A or PG33A (FIG. 6);
Dor = delay of OR circuit of FIG. 1 and FIG. 6;
Dtog = delay of toggle latch of FIG. 1 and FIG. 6;
Dx = delay of latency correction block of FIG. 6;
D = delay of variable delay line of FIG. 6;
ts = setup time of sampling latch;
Df = delay of one fine element of variable delay line;
Dcoarse = delay of coarse element of variable delay line;
Dbuf = delay of buffer element of variable delay line; and
Latency = time delay between rising edge of "EXTR" and the corresponding rising (or falling) edge of the output signal.

The control circuitry adjusts the delays in each segment of the variable delay line so that signal PG33 rises at approximately the same time that signal "EXTRB" rises. Any uncertainty in the timing of PG33 relative to "EXTRB" is due to two factors: (1) the setup time, tx, of the sampling latch; and (2) jitter. Jitter occurs because the number of delay elements in each leg must be an integer. At steady state, if PG33 rises before "EXTRB", then one Df element is added to each segment, which causes PG33 to rise after "EXTRB" rises on the next cycle. The control circuitry then removes one Df element from each segment. (This cycle is repeated ad infinitum until an external condition such as a shift in voltage or temperature causes an actual change in the delays of each segment.) The maximum jitter in PG33 is three Df elements.

Thus, $$3D + 3Dx + Dpg = T + Drb - tx + / - jitter$$

Hence, $$D + Dx = (T/3) + ((Drb - ts - Dpg)/3) + / - (Df) \qquad (1)$$

If Drb is designed to equal the delay of the pulse generator and the setup time of the sampling latch, then $D + Dx = (T/3) +/- Df$.

The time between output switchings (i.e., the phase lengths) can be found as follows:
PG13A pulsing causes the output to toggle at time:

$$D + Dgp + Dor + Dtog.$$

PG23A pulsing causes the output to toggle at time:

$$2D + Dx + Dpg + Dor + Dtog.$$

PG33A pulsing causes the output to toggle at time:

$$3D + 2Dx + Dpg + Dor + Dtog.$$

Thus, phase length between PG13A and PG23A = $2D + Dx + Dpg + Dor + Dtog - (D + Dpg + Dor + Dtog)$ which equals $D + Dx$.
Phase length between PG23A and PG33A = $3D + 2Dx + Dpg + Dor + Dtog - (2D + Dx + Dpg + Dor + Dtog)$, which equals $D + Dx$.
Phase length between PG33A and PG13A = $T + D + Dpg + Dor + Dtog - (3D + 2Dx + Dpg + Dor + Dtog)$, which implies that the phase length between PG33A and PG13A is equal to:

$$T - 2D - 2Dx = T - 2(D + Dx).$$

Thus, if $D + Dx = T/3$ then each phase will be equal to T/3 and the output signal will have a 50% duty cycle.
From equation (1) above, $D + Dx$ approximates T/3 when $Drb = Dpg + ts$ and when Df is as small as possible.
The shortest phase length is:

$$(T/3) - 2Df - 2(Drb - ts - Dpg). \qquad (2)$$

The latency associated with this circuit is the time difference between the output due to PG33A and the external clock signal.

$$\begin{aligned} \text{Latency} &= 3D + 2Dx + Dpg + Dor + Dtog - T \\ &= 3D + 3Dx - Dx + Dpg + Dor + Dtog - T \\ &= 3(D + Dx) + (Dpg + Dor + Dtog) - Dx - T \end{aligned}$$

But from equation (1), $$3(D + Dx) = T + (Drb - ts - Dpg) + / - 3Df$$

Hence, $$Latency = (Drb - ts - Dpg) + / - (3Df + Dpg + Dor + Dtog) - Dx.$$

For equal phase lengths, $Drb - ts - Dpg = 0$. Using circuit simulation, if Dx is designed to have the same delay as the delay through the pulse generator, OR and toggle circuits, then latency can be reduced to a very small value. It cannot be reduced to exactly zero, however, because of jitter.

There is an upper bound on Dx. On reset, the total delay of each delay segment must be less than T/3, otherwise the control circuitry will continue to add delay to each segment until the total delay of all legs is 2T, rather than the desired T. In order for the stable point to be some small number (say 10 or so) of fine delay elements from the start of the delay chains, then the initial delay, Dinit, which equals Dcoarse+Dbuf+Dx must be less than $(T/3) - (10*Df)$. These conditions are not constraining, however. For example, suppose T=20.00 ns ("EXTR"=50 MHz), and Df=0.25 ns, then Dinit must be $< (20.00/3) - 10(0.25) = 4.17$ ns. If Dcoarse+Dbuf=2.0 ns, then Dx can be 2.17 ns. If Dpg+Dor+Dtog =1.5 ns, so that Dpg+Dor+Dtog+3Df=2.25 then the maximum positive latency=2.25−2.17 ns=0.08 ns.

From equation (2) it can be seen that there are two possible sources of error: Drb not equalling Dpg +ts and the width of Df. Care must be taken in the circuit design of these elements to reduce errors to the greatest extent possible. The total number of cycles required to obtain a stable output signal is approximately $((T/3) - Dcoarse - Dbuf - Dx)/Df$, after "RESET" is activated.

Since the design is modular with relatively low wiring requirements, it can easily be modified to accept various ranges of input frequencies. The total number of line delay stages required in each leg is approximately $((T/3) - Dcoarse - Dbuf - Dx)/Df$. If the input frequency range is very large, then more than one clock multiplier might be necessary with different delay values. For example, if Dcoarse+Dbuf+Dx=3 ns, Df=0.1 ns and T=20.0 ns (50 MHz), then the number of fine delay stages/segment=3. But if T=100 ns (10 MHz), then the number of stages needed per leg=303. Since, this could be prohibitive in size, it might better to design another clock multiplier with different Dcoarse values to reduce the overall circuit size. Each leg should be designed with the exact same circuit elements and adjacent to one another so that the delays in each leg are matched as closely as possible. Extending the present invention to a (N)÷2 multiplier circuit is straightforward. The number of delay line segments within the variable delay line determines (N). A 2/2 (1×) clock generator is achieved with two segments, a 4/2 (i.e., 2×) clock generator with four segments, etc.

In the above description it will be observed that a digital circuit is provided that produces a 1.5× (3/2×) clock output with very low latency and a near fifty (50%) percent duty cycle given an external clock signal with an arbitrary duty cycle and a substantially steady (or slowly varying) frequency. The extension of the design to an (N/2)× multiplier circuit (wherein N is a positive integer) is straight forward. The design is modular in nature, thereby allowing easy implementation for different input frequencies and good delay matching.

Although specific embodiments of the present invention have been illustrated in the accompanying drawings and described in the foregoing detailed description, it will be understood that the invention is not limited to the particular embodiments described herein, but is capable of numerous rearrangements, modifications and substitutions without departing from the scope of the invention. The following claims are intended to encompass all such modifications.

We claim:

1. A digital semiconductor chip multiplier circuit for generating an internal clock signal from an external clock signal of frequency (f) and period (T), said multiplier circuit generating said internal clock signal with a frequency (X)×(f), wherein X≧1, said multiplier circuit comprising:
   automated digital means for generating multiple symmetrical pulse signals in response to a periodic transition within said external clock signal, each pulse signal of said multiple symmetrical pulse signals having a different duty cycle than a duty cycle of the external clock signal, one of said pulse signals generated in response to said periodic transition being synchronized with said period (T) of the external clock signal;
   an output generator coupled to receive pulse signals generated by said automated digital means and produce therefrom said internal clock signal of frequency (X)×(f); and
   control circuitry coupled to said automated digital means for controlling timing of said symmetrically generated, multiple pulse signals such that said output generator produces said internal clock signal of frequency (X)×(f), wherein X≧1, said control circuitry being coupled to receive for comparison said external clock signal and one of said multiple pulse signals output from said automated digital means.

2. The multiplier circuit of claim 1, wherein said (X)=(N/2) such that said generated internal clock signal produced by said output generator has a frequency (N/2)×(f), wherein N=2, 3, 4 . . . .

3. The multiplier circuit of claim 2, wherein said output generator includes combinatorial logic coupled to receive said pulse signals generated by said automated digital means and a toggle latch connected to receive output from said combinatorial logic, said toggle latch outputting therefrom said internal clock signal of frequency (N/2)×(f).

4. The multiplier circuit of claim 1, wherein said automated digital means comprises:
   a variable delay line coupled to receive said external clock signal, said variable delay line having (N) equal segments, each segment having multiple identical delay elements therein, said identical delay elements each being tapped to allow selective output of a corresponding delay signal, said control circuitry allowing only one delay signal to be output from each of said (N) equal segments; and
   (N) pulse generators, each pulse generator being coupled to receive a respective one of the outputted delay signals of said (N) equal segments of the variable delay line and output in response thereto a pulse signal, each pulse signal having a duty cycle different from a duty cycle of the external clock signal.

5. The multiplier circuit of claim 4, wherein said control circuitry includes a circular shift register and multiple control switches, said circular shift register controlling activation/deactivation of said multiple control switches, each of said multiple control switches being connected to receive said delay signals output from said identical delay elements and allow selective output of one of said delay signals for each of said (N) equal segments of said variable delay line.

6. The multiplier circuit of claim 5, wherein adjacent delay signals output from said (N) equal segments of said variable delay line are each offset by a (T)/(N) phase length.

7. The multiplier circuit of claim 1, wherein said (X)=(N/2) such that said generated internal clock signal produced by said output generator has a frequency (N/2)×(f), wherein N=3, 5, 7 . . . .

8. A clock signal multiplier circuit, said clock signal multiplier circuit receiving an external clock signal having a frequency (f) and a period (T) and outputting in response thereto a clock signal having a frequency (N/2)×(f), wherein N=2, 3, 4 . . . , said clock signal multiplier circuit comprising:

a variable delay line coupled to receive said external clock signal, said variable delay line having (N) equal segments, each segment having multiple delay elements, said multiple delay elements being identical within said (N) equal segments and each being tapped to allow selective output of a corresponding delay signal;

multiple control switches, each delay element of each variable delay line segment having one of said multiple control switches coupled thereto for control of issuance of its corresponding delay signal, wherein said multiple control switches limit each of said (N) equal segments of said variable delay line to outputting one delay signal as said external clock signal propagates through said variable delay line;

(N) pulse generators, each pulse generator being coupled to receive a respective one of the outputted delay signals from said (N) equal segments of said variable delay line and output in response thereto a pulse signal, each pulse signal having a duty cycle different from a duty cycle of the external clock signal;

an output generator coupled to receive pulse signals output from said (N) pulse generators and therefrom produce said clock signal of frequency (N/2)×(f); and control circuitry coupled to said multiple control switches for controlling issuance of said one delay signal output from each of said (N) equal segments via activation/deactivation of said multiple controllable switches, said control circuitry being coupled to receive for comparison said external clock signal and one of said delay signals output from said (N) equal segments of said variable delay line.

9. The clock signal multiplier circuit of claim 8, wherein the delay signals output from said variable delay line are each offset by a (T)/(N) phase length.

10. The clock signal multiplier circuit of claim 8, wherein said clock signal output in response to said external clock signal has a near 50% duty cycle independent of duty cycle of said external clock signal.

11. The clock signal multiplier circuit of claim 8, wherein at least some of said multiple delay elements of said variable delay line comprise fine delay elements each having a delay measured in tenths of a nanosecond.

12. The clock signal multiplier circuit of claim 8, wherein (N)=3 such that said clock signal output in response to said external clock signal has a frequency 1.5×(f).

13. The clock signal multiplier circuit of claim 8, wherein each of said (N) equal segments of said variable delay line includes a fixed, coarse delay of preassigned time.

14. The clock signal multiplier circuit of claim 13, further comprising means for correcting any latency between said external clock signal and said clock signal outputted in response thereto.

15. The clock signal multiplier circuit of claim 14, wherein said latency correction means includes a buffer having delay (Dx) disposed at the output of each of said (N) equal segments of said variable delay line, said buffer delay (Dx) being substantially equal to any latency between said external clock signal and said clock signal outputted by said clock signal multiplier circuit in response thereto, and being employed by said control circuitry to compensate for said latency.

16. The clock signal multiplier circuit of claim 8, wherein said output generator includes combinatorial logic and a toggle latch, said combinatorial logic receiving said pulse signals output from said (N) pulse generators and said toggle latch outputting therefrom said clock signal of frequency (N/2)×(f).

17. The clock signal multiplier circuit of claim 8, wherein said control circuitry includes a circular shift register and wherein said multiple control switches comprise pass gate switches coupled to each delay element of each variable delay line segment, said pass gate switches being activated/deactivated by said circular shift register, only one of said pass gate switches being activated per variable delay line segment.

18. The clock signal multiplier circuit of claim 17, wherein said control circuitry includes a sampling latch coupled to receive for comparison said external clock signal and said one of said delay signals output from said (N) equal segments of said variable delay line.

19. The clock signal multiplier circuit of claim 18, wherein said one of said delay signals output from said (N) equal segments comprises a delay signal output from a last segment of said (N) equal segments of said variable delay line, said control circuitry including means for aligning the phase of said delay signal output from said last segment with the phase of said external clock signal.

20. The clock signal multiplier circuit of claim 8, wherein (N)=3, 5, 7 . . . .

* * * * *